(12) United States Patent
Wong et al.

(10) Patent No.: US 8,202,393 B2
(45) Date of Patent: Jun. 19, 2012

(54) ALTERNATE GAS DELIVERY AND EVACUATION SYSTEM FOR PLASMA PROCESSING APPARATUSES

(75) Inventors: Harry P. Wong, Fremont, CA (US); Vernon Wong, Mountain View, CA (US); Christopher Charles Griffin, Milpitas, CA (US); Mark Taskar, San Mateo, CA (US)

(73) Assignee: Lam Research Corporation, Fremont, CA (US)

( * ) Notice: Subject to any disclaimer, the term of this patent is extended or adjusted under 35 U.S.C. 154(b) by 832 days.

(21) Appl. No.: 12/230,089

(22) Filed: Aug. 22, 2008

(65) Prior Publication Data

US 2009/0061640 A1     Mar. 5, 2009

Related U.S. Application Data

(60) Provisional application No. 60/935,750, filed on Aug. 29, 2007.

(51) Int. Cl.
*H01L 21/00* (2006.01)
*C23C 16/00* (2006.01)
*C23C 14/00* (2006.01)

(52) U.S. Cl. ......... 156/345.29; 156/345.26; 156/345.34; 118/715

(58) Field of Classification Search .................. 118/715; 156/345.29, 345.26, 345.34
See application file for complete search history.

(56) References Cited

U.S. PATENT DOCUMENTS

| | | | |
|---|---|---|---|
| 5,515,676 A * | 5/1996 | Earle | ............... 60/410 |
| 5,993,594 A | 11/1999 | Wicker et al. | |
| 6,333,272 B1 | 12/2001 | McMillin et al. | |
| 6,924,235 B2 | 8/2005 | Johnson et al. | |
| 6,984,288 B2 | 1/2006 | Dhindsa et al. | |
| 7,169,231 B2 | 1/2007 | Larson et al. | |
| 2005/0241763 A1 | 11/2005 | Huang et al. | |
| 2007/0066038 A1 | 3/2007 | Sadjadi et al. | |

FOREIGN PATENT DOCUMENTS

JP          05136098 A    *    6/1993

* cited by examiner

*Primary Examiner* — Ram N. Kackar

(74) *Attorney, Agent, or Firm* — Buchanan Ingersoll & Rooney PC

(57) ABSTRACT

A gas distribution system for supplying a gas mixture to a plasma process chamber is provided. A first valve arrangement is connected to upstream ends of a first gas line and a second gas line. A second valve arrangement is connected to downstream ends of the first gas line and the second gas line. A first gas distribution outlet line is connected between a gas supply and the first valve arrangement and a first chamber inlet line connected between the second valve arrangement and the plasma process chamber. A first evacuation line is connected to the first gas line at a location between the first valve arrangement and the second valve arrangement. A second evacuation line is connected to the second gas line at a location between the first valve arrangement and the second valve arrangement. The first evacuation line and second evacuation line are in fluid communication with a vacuum line. A controller is operable to actuate the first valve arrangement and second valve arrangement to selectively flow the gas mixture from the gas supply to the plasma process chamber through the first gas line while the second gas is selectively evacuated by the vacuum line; or to selectively flow the gas mixture from the gas supply to the plasma process chamber through the second gas line while the first gas line is selectively evacuated by the vacuum line.

20 Claims, 10 Drawing Sheets

ALTERNATE GAS DELIVERY AND EVACUATION SYSTEM FOR PLASMA PROCESSING APPARATUSES

RELATED APPLICATIONS

This application claims priority under 35 U.S.C. 119 to U.S. Provisional Application No. 60/935,750 entitled ALTERNATE GAS DELIVERY AND EVACUATION SYSTEM FOR PLASMA PROCESSING APPARATUSES and filed on Aug. 29, 2007, the entire content of which is hereby incorporated by reference.

BACKGROUND

Semiconductor structures are processed in plasma processing apparatuses including a plasma processing chamber, a gas source that supplies gas mixtures into the chamber, and an energy source that produces plasma from the process gas. Semiconductor structures are processed in such apparatuses by techniques including dry etching processes, deposition processes, such as chemical vapor deposition (CVD), physical vapor deposition, or plasma-enhanced chemical vapor deposition (PECVD) of metal, dielectric and semiconductor materials and resist stripping processes. Different process gases are used for these processing techniques, as well as processing different materials of semiconductor structures.

SUMMARY

A gas distribution system for supplying a gas mixture to a plasma process chamber is provided. A first valve arrangement is connected to upstream ends of a first gas line and a second gas line. A second valve arrangement is connected to downstream ends of the first gas line and the second gas line. A first gas distribution outlet line is connected between a gas supply and the first valve arrangement and a first chamber inlet line connected between the second valve arrangement and the plasma process chamber. A first evacuation line is connected to the first gas line at a location between the first valve arrangement and the second valve arrangement. A second evacuation line is connected to the second gas line at a location between the first valve arrangement and the second valve arrangement. The first evacuation line and second evacuation line are in fluid communication with a vacuum line. A controller is operable to actuate the first valve arrangement and second valve arrangement to selectively flow the gas mixture from the gas supply to the plasma process chamber along the first gas line while the second gas is selectively evacuated by the vacuum line; or to selectively flow the gas mixture from the gas supply to the plasma process chamber along the second gas line while the first gas line is selectively evacuated by the vacuum line.

In another embodiment, a method of processing a semiconductor wafer in a plasma process chamber incorporating the gas distribution system is provided. The semiconductor wafer is placed in the plasma process chamber. A first gas mixture is flowed into the plasma process chamber with the first gas line, while simultaneously evacuating the second gas line with a vacuum line. A first plasma is generated with the first gas mixture. The wafer is processed with the first plasma and the first plasma is extinguished. The flow of the first gas mixture in the first gas line is terminated. A second gas mixture is flowed into the plasma processing chamber with the second gas line within less than about 10 seconds of terminating the flow of the first gas mixture in the first gas line, while simultaneously evacuating the first gas line with the vacuum line. A second plasma is generated with the second gas mixture. The wafer is processed with the second plasma and the second plasma is extinguished by terminating flow of the second gas mixture in the second gas line.

DETAILED DESCRIPTION

Plasma processing apparatuses for processing semiconductor materials, such as semiconductor devices formed on semiconductor substrates, e.g., silicon wafers, include a plasma processing chamber wherein various process steps such as etching, deposition, resist stripping, etc. can be carried out and a gas distribution system that supplies process gas into the plasma processing chamber. The gas distribution system can distribute gas to a single zone or multiple zones, such as center (inner) and edge (outer) zones, across the surface of a wafer during plasma processing. The gas distribution system can include flow controllers to control the flow ratio of the same or different process gas, or gas mixture, to the zones, thereby allowing in-process adjustment of across-substrate uniformity of gas flow and gas composition.

Figure 1A:
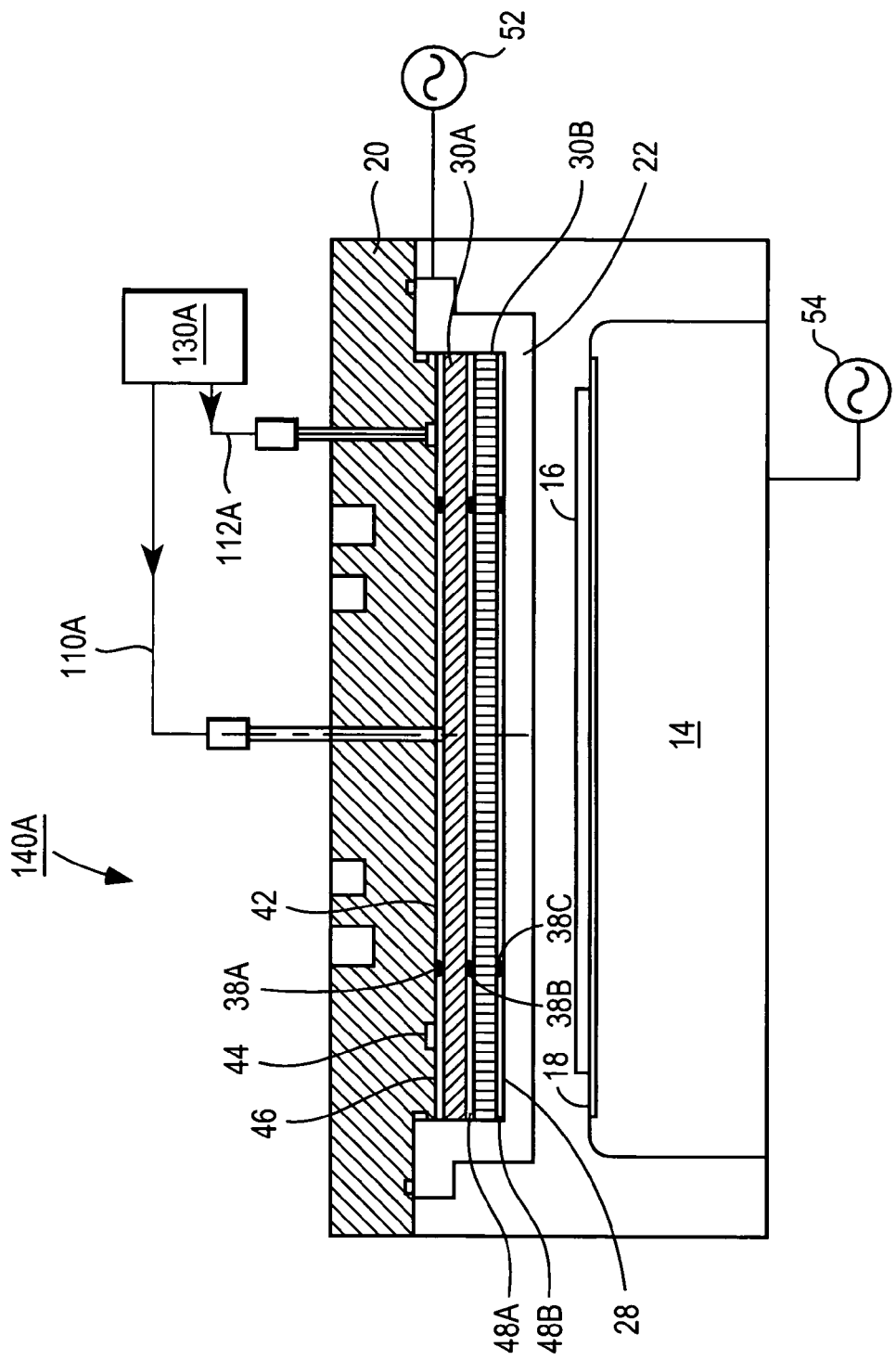
FIG. 1A is a cross-sectional view of an exemplary embodiment of a plasma processing apparatus.

FIG. 1A illustrates an exemplary semiconductor material plasma process chamber 140A. Plasma process chamber 140A comprises an interior containing a substrate support 14 on which a wafer 16 is supported during plasma processing. The substrate support 14 includes a clamping device, preferably an electrostatic chuck 18, which is operable to clamp the wafer 16 on the substrate support 14 during processing. The wafer can be surrounded by focus rings and/or edge rings (not shown), disclosed in commonly-owned U.S. Pat. No. 6,984,288 hereby incorporated by reference.

The exemplary plasma process chamber 140A shown in FIG. 1A includes a showerhead electrode assembly having a top plate 20 forming a wall of the plasma chamber and a showerhead electrode 22 attached to the top plate 20. A baffle assembly is located between the showerhead electrode 22 and the top plate 20 to uniformly distribute process gas to a backside 28 of the showerhead. The baffle assembly can include one or more baffle plates. In the embodiment, the baffle assembly includes baffle plates 30A, 30B. Open plenums 48A, 48B are defined between the baffle plates 30A, 30B; and between the baffle plate 30B and showerhead electrode 22. The baffle plates 30A, 30B and showerhead electrode 22 include through passages for flowing process gas into the interior of plasma process chamber 140A.

In the embodiment of FIG. 1A, the plenum between the top plate 20 and the baffle plate 30A and the plenums 48A, 48B between the baffle plates 30A, 30B are divided into a center zone 42 and an edge zone 46 by seals 38A, 38B, 38C, such as O-rings. The center zone 42 and edge zone 46 can be supplied process gas having different respective gas chemistries and/or flow rates by the gas source 130A (e.g., a gas distribution panel containing multiple gas sources). Gas is supplied to the center zone 42 from first gas line 110A and to the edge zone 46 from second gas line 112A via an annular channel 44.

The process gas flows through the passages in the baffle plates 30A, 30B and the showerhead electrode 22 and into the interior of the plasma process chamber 140A. Next, the process gas is energized into the plasma state in the plasma process chamber 140A by a power source 52, such as an RF source driving showerhead electrode 22, and/or a power source 54 at one or more frequencies (e.g., 2 MHz, 13.56 MHz, 60 MHz) driving an electrode in the substrate support 14 at one or more frequencies (e.g., 2 MHz, 13.56 MHz, 60 MHz). The RF power applied to the showerhead electrode 22 can be changed to perform different process steps such as when different gas compositions are supplied into the plasma process chamber 140A.

In one embodiment, the plasma can be generated in the interior of plasma process chamber 140A by supplying RF energy from two RF sources to the showerhead electrode 22 and/or the substrate support 14, or the showerhead electrode 22 can be electrically grounded and RF energy at a single frequency or multiple frequencies can be supplied to the substrate support 14.

Figure 1B:
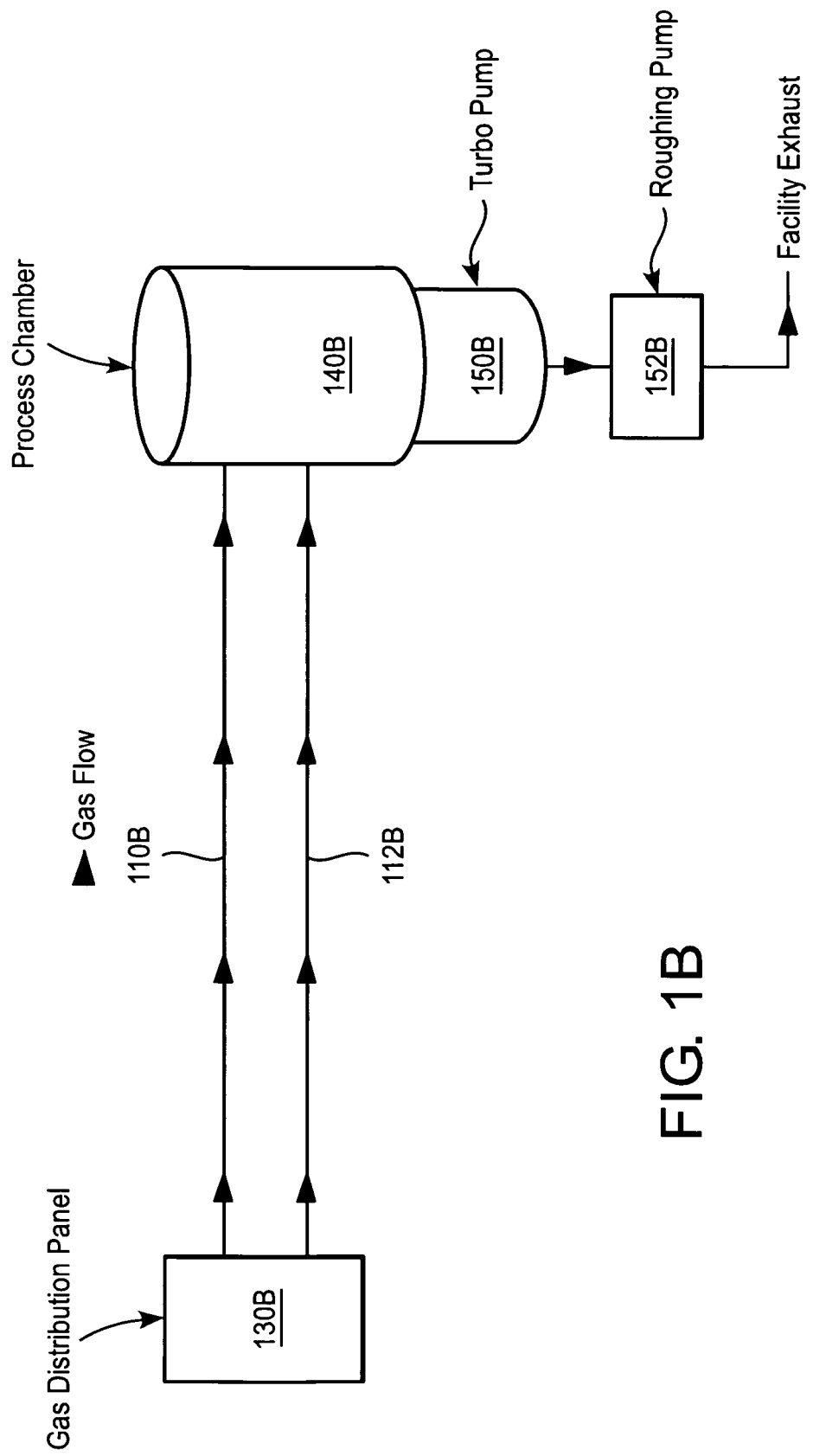
FIG. 1B illustrates one embodiment of a gas delivery system from a gas supply to a center and edge zone of a plasma process chamber.

FIG. 1B illustrates an embodiment of a gas delivery system from gas supply 130B to a center and edge zone of plasma process chamber 140B containing a semiconductor wafer (not shown). Gas mixtures are delivered to the center and edge zones of plasma process chamber 140B, along first gas line 110B and second gas line 112B, respectively. The pressure in plasma process chamber 140B is maintained at a vacuum pressure (e.g., >50 to 200 mTorr) by turbomolecular pump 150B and roughing pump 152B. Gases removed from the plasma process chamber 140B and the gas lines by turbomolecular pump 150B and roughing pump 152B are released into the facilities exhaust system.

For example, gas supply 130B can be a gas distribution panel containing multiple gas sources used for dry etching, each gas source in fluid communication with first gas line 110B and second gas line 112B. Individual gases can be premixed before being delivered along first gas line 110B and second gas line 112B. Furthermore, gas supply 130B can comprise a gas manifold with flow control devices, such as mass flow controllers to adjust the flow of each gas. Examples of gases include hydrocarbon gases (e.g., $C_xH_y$), fluorocarbon gases (e.g., $C_xF_y$), hydrofluorocarbon gases (e.g., $C_xH_yF_z$), halogen-containing gases (e.g., $NF_3$, HBr, $Cl_2$), oxygen-containing gases (e.g., $O_2$), nitrogen-containing gases (e.g., $N_2$, $NH_3$) or inert gases (e.g., He, Ar). Gas mixtures can be delivered by fast-switching gas systems, for example, in commonly-owned U.S. Patent Application Publication Nos. 2005/0241763 and 2007/0066038, which are incorporated herein by reference in their entirety.

Figure 1C:
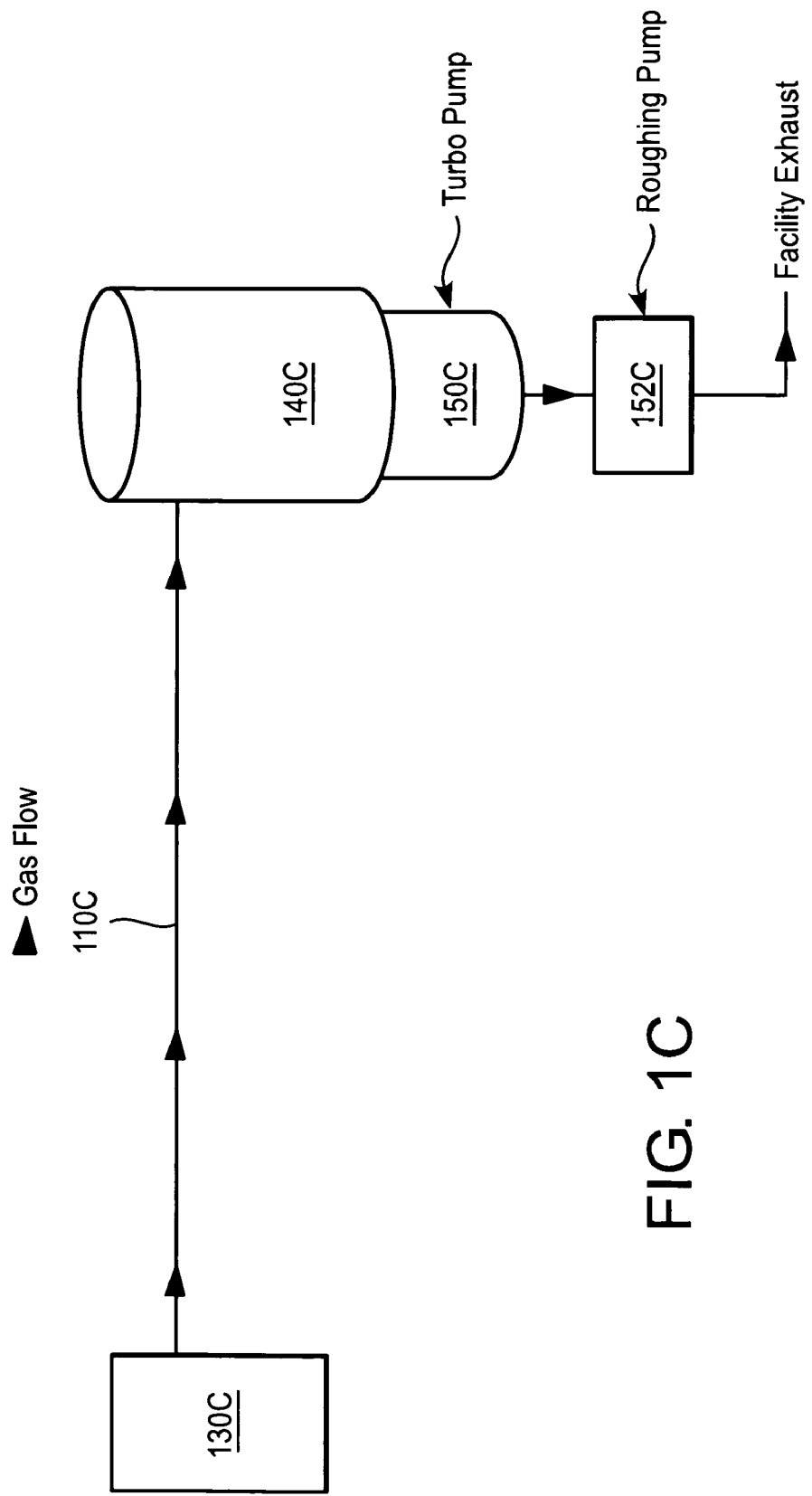
FIG. 1C illustrates another embodiment of a gas delivery system from a gas supply to a single zone of a plasma process chamber.

In another embodiment, baffle plates 30A, 30B from FIG. 1A include a single zone, supplied by a single gas source line, rather than the multiple zones (i.e., center zone 42 and edge zone 46). FIG. 1C illustrates an embodiment of a gas delivery system from gas supply 130C to a single zone of plasma process chamber 140C containing a semiconductor wafer (not shown). Gas mixtures are delivered to plasma process chamber 140C, along a single gas line 110C. The pressure in plasma process chamber 140C is maintained at a vacuum pressure (e.g., >50 to 200 mTorr) by turbomolecular pump 150C and roughing pump 152C. Gases removed from the plasma process chamber 140C and the gas lines by turbomolecular pump 150C and roughing pump 152C are released into the facilities exhaust system.

For certain etching applications, it is necessary to etch the same semiconductor wafer successively with multiple plasmas of different gas chemistries in the same plasma process chamber 140A, 140B, 140C. For example, a two-step etch recipe may require generating a first plasma with a first gas mixture followed by generating a second plasma with a second gas mixture. After plasma etching with the first gas mixture is completed, the flow of the first gas mixture is terminated and the first plasma is extinguished. A second plasma is generated with a second gas mixture to further etch the same wafer. The total etching time for any specific gas composition can be between about 1 to 2 minutes. However, if a gas distribution system distributes a first gas mixture and a second gas mixture through the same gas lines, remnants of the first gas mixture can contaminate the second gas mixture, altering the plasma gas chemistry and adversely affecting the etch profile.

One approach for preventing the contamination of gas mixtures is to cleanse processing gas remnants by evacuating the gas lines prior to the changeover from the first gas mixture to the second gas mixture. Gas lines can be evacuated with a vacuum pump in fluid communication with the gas lines, evacuating the gas lines to a pressure of below about 30 Torr. Depending upon the length of the gas lines and the desired pressure, this evacuation step can introduce a changeover time in the overall wafer processing. For example, the changeover time between the termination of flow of the first process and the beginning of flow of the second gas mixture can be between about 10 and about 15 seconds for gas lines about 8 meters in length from the gas source to the plasma process chamber. If the total etch time is about 60 seconds, then a 15 second changeover time associated with the evacuation of gas lines is a significant delay, because this changeover time represents one-quarter of the overall etching time. For a high volume semiconductor wafer processing facility, this changeover time can lower the overall throughput of a plasma etching apparatus, up to 100 wafers per day. Thus, a need exists for a gas distribution system for distributing multiple processing gases, in which the changeover time between the termination of flow of the first gas mixture and the flow of the second gas mixture is under about 10 seconds, preferably under about 5 seconds and more preferably under about 3 seconds.

Figure 2A:
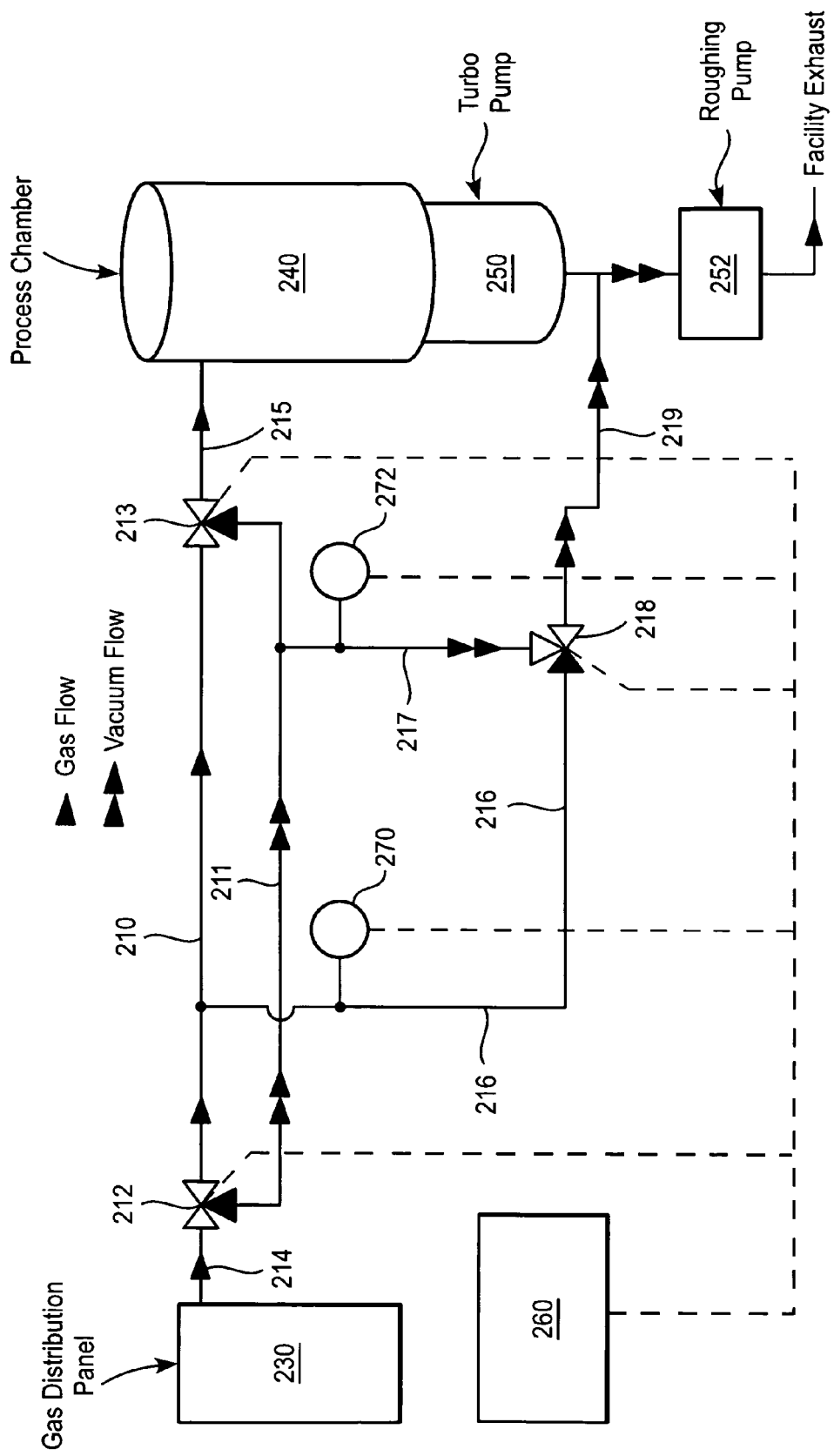
FIGS. 2A-2B illustrate an embodiment of the gas distribution system with two alternating gas lines to supply gas mixtures to a plasma chamber.
Figure 2B:
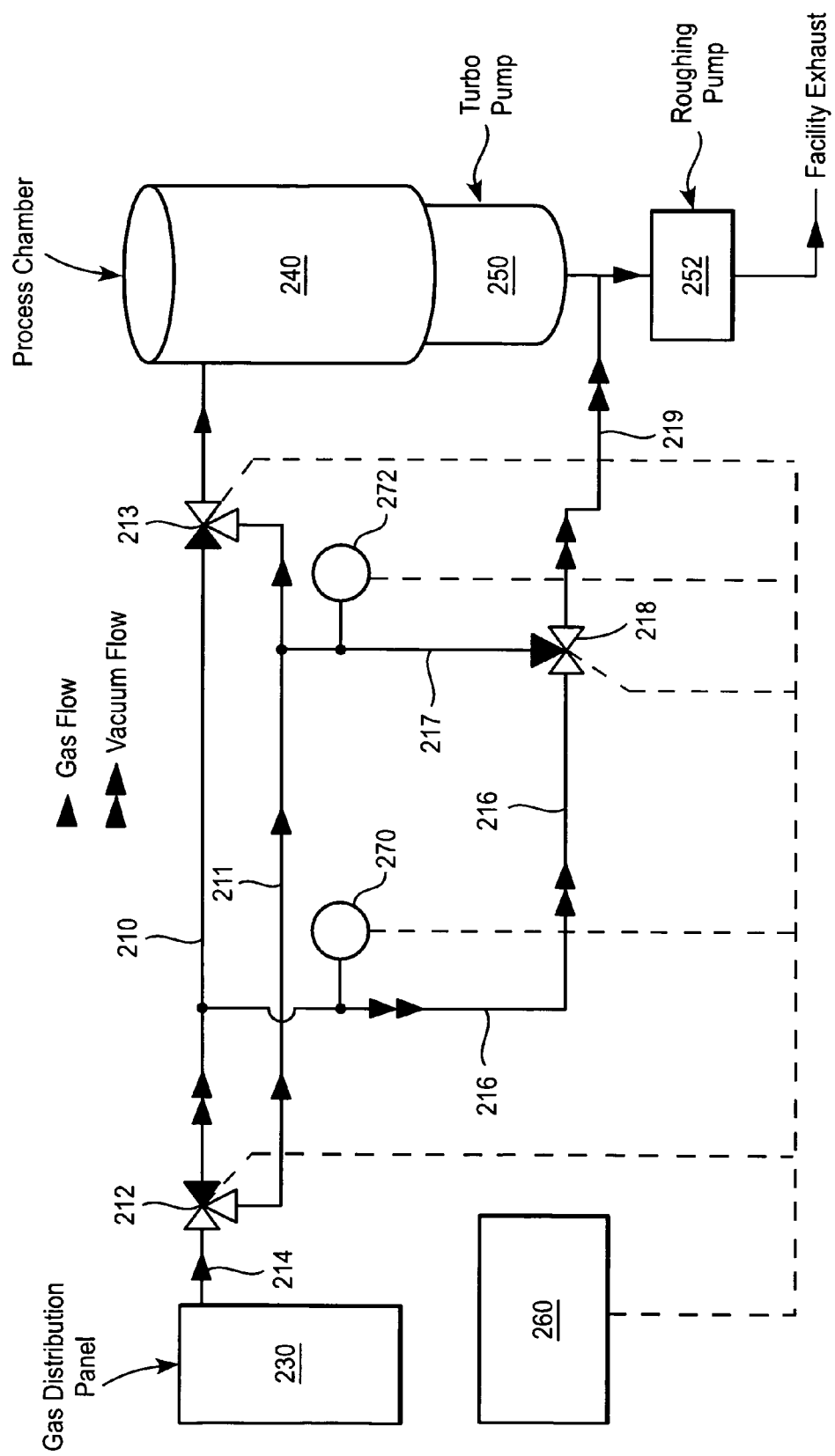

FIGS. 2A and 2B illustrate an embodiment of a gas delivery system for a single zone in which the flow of gas mixture is alternated between a primary gas line (first gas line 210) and an alternate gas line (second gas line 211) to deliver gas mixtures from gas supply 230 to a plasma process chamber 240 containing a semiconductor wafer (not shown). The pressure in plasma process chamber 240 is maintained at a vacuum pressure (e.g., >50 to 200 mTorr) by turbomolecular pump 250 and roughing pump 252. Gases removed from the plasma process chamber 240 and the gas lines by turbomolecular pump 250 and roughing pump 252 are released into the facilities exhaust system. In this embodiment, gas mixtures are delivered along first gas line 210, while second gas line 211 is simultaneously evacuated with roughing pump 252 and vice versa. Initially, first gas line 210 and second gas line 211 are maintained in an evacuated state (e.g., a vacuum pressure below about 30 Torr, 20 Torr or 10 Torr).

FIG. 2A illustrates the flow of a first gas mixture though a primary gas line, first gas line 210 (as indicated by the single-headed arrows), while an alternate gas line, second gas line 211 is simultaneously evacuated (as indicated by the double-headed arrows). From FIG. 2A, a first valve arrangement 212 and second valve arrangement 213 are at upstream and downstream ends of first gas line 210 and second gas line 211. A first gas distribution outlet line 214 connects the gas supply 230 to the first valve arrangement 212. A first chamber inlet line 215 connects the second valve arrangement 213 to the plasma process chamber 240. First valve arrangement 212 and second valve arrangement 213 can be automatically operated to restrict the flow of a gas mixture either along first gas line 210 or second gas line 211. The darkened regions of first valve arrangement 212 and second valve arrangement 213 indicate that the valves shut off flow to second gas line 211. The first valve arrangement 212 and second valve arrangement 213 can be double-actuated three-way gas valves, in which an electrical signal is used to actuate the valves between two gas flow positions (e.g. first gas mixture flows through first gas distribution outlet line 214 to either the first gas line 210 or second gas line 211). Other valve arrangements can be used to accomplish the gas switching. In one embodiment, first gas distribution outlet line 214 can be split into two branches connected to two upstream valves at upstream ends of first gas line 210 and second gas line 211 and first chamber inlet line 215 can be split into two branches connected to two downstream valves at downstream ends of lines first gas line 210 and second gas line 211 (e.g., Y-shaped double valve) (not shown in FIG. 2).

FIG. 2A also illustrates the simultaneous evacuation of second gas line 211. Roughing pump 252 is in fluid communication with first gas line 210 and second gas line 211, along first evacuation line 216 and second evacuation line 217, respectively. Third valve arrangement 218 is connected between a vacuum line 219 and the downstream ends of the first evacuation line 216 and the second evacuation line 217. As illustrated in FIG. 2A, third valve arrangement 218 shuts off flow to first evacuation line 216, as indicated by the darkened region, to selectively evacuate second gas line 211 through second evacuation line 217. In one embodiment, third valve arrangement 218 is a double-actuated three-way gas valve, in which an electrical signal is used to actuate the valve between two gas flow positions. However, separate valves can be connected to the downstream ends of first evacuation line 216 and second evacuation line 217, if desired and vacuum line 219 could be split into two branches connected to such separate valves (e.g., Y-shaped double valve).

From FIG. 2A, controller 260 is operable to actuate first valve arrangement 212, second valve arrangement 213 and third valve arrangement 218 to selectively flow the first gas mixture from the gas supply 230 to the processing chamber 240 along the first gas line 210, while the second gas line 211 is selectively evacuated by the roughing pump 250. Electrical connections from controller 260 to each individual valve are illustrated in FIG. 2A as dashed lines. The controller 260 can be a separate component or incorporated in components such as gas supply 230 and/or process chamber 240.

A first plasma is generated with the first gas mixture for processing the wafer in plasma process chamber 240. After etching with the first gas mixture has been completed, the first plasma is extinguished by terminating flow of the first gas mixture from gas supply 230. Thus, the changeover time between the termination of flow of the first gas mixture in first gas line 210 and the start of flow of the second gas mixture in the second gas line 211 can be significantly reduced, compared to use of single lines to the plasma process chamber (i.e., FIG. 1A embodiment), because second gas line 211 is evacuated during flow of the first gas mixture in first gas line 210 and thus ready for switchover to the second gas mixture immediately upon termination of flow of the first gas mixture.

During a changeover, remnants of the first gas mixture, second gas mixture, etc. can remain trapped in the first gas distribution outlet line 214 and first chamber inlet line 215 because these sections of the gas distribution system are not evacuated. Thus, the length of first gas outlet line 214 and the first chamber inlet line 215 should be minimized. For example, if first gas line 210 or second gas line 211 are individually about 8 meters in length, the lengths of the first gas outlet line 214 or first chamber inlet line 215 are less than 10% the length of first gas line 210 or second gas line 211, preferably less than 5% (e.g., <4%, <3% or <2%), e.g., about 12 to 15 centimeters in length.

A first pressure switch 270 and a second pressure switch 272 are arranged along first evacuation line 216 and second evacuation line 217, respectively. First pressure switch 270 and second pressure switch 272 ensure that either the first evacuation line 210 or the second evacuation line 211 have been properly evacuated (e.g., a vacuum pressure below about 30 Torr, 20 Torr or 10 Torr). For example, during flow of the first gas mixture through first gas line 210 and evacuation of second gas line 211, second pressure switch 272 sends an electrical signal to controller 260 indicative of when second gas line 211 and second evacuation line 217 are evacuated to a pressure of 10 Torr or lower. Likewise, during the flow of a second gas mixture through second gas line 211 and evacuation of first line 210, first pressure switch 270 sends an electrical signal to controller 260 indicative of when first gas line 210 and first evacuation line 216 are evacuated to a pressure of 10 Torr or lower. Electrical connections from controller 260 to each individual pressure switch are illustrated in FIG. 2A as dashed lines.

FIG. 2B illustrates the flow of a second gas mixture though the alternate gas line, second gas line 211, (as indicated by the single-headed arrows), while the primary gas line, first gas line 210 is simultaneously evacuated (as indicated by the double-headed arrows). The darkened regions of first valve arrangement 212 and second valve arrangement 213 indicate that the valves prevent flow of the second gas mixture from supply 230 along first gas line 210. A second plasma is generated with the second gas mixture for processing the wafer in plasma process chamber 240.

From FIG. 2B, controller 260 is operable to monitor first pressure switch 270 and second pressure switch 272 and actuate first valve arrangement 212, second valve arrangement 213 and third valve arrangement 218 to selectively flow the second mixed gas from the gas supply 230 to the plasma process chamber 240 along the second gas line 211, while the first gas line 210 is selectively evacuated by the roughing pump 252. Electrical connections from controller 260 to each individual valve are illustrated in FIG. 2B as dashed lines.

FIG. 2B also illustrates the simultaneous evacuation of first gas line 210. As illustrated in FIG. 2B, third valve arrangement 218 is closed to second evacuation line 217, as indicated by the darkened region, to selectively evacuate first gas line 210. After etching with the second gas mixture has been completed, the second plasma is extinguished and flow of the second gas mixture from gas supply 230 is terminated. Thus, the changeover time between the termination of flow of the second gas mixture and the flow of any additional gas mixtures in first gas line 210 is significantly reduced, because first gas line 210 is evacuated during flow of the second gas mixture in second gas line 211, rather than after flow of the second gas mixture has been completed.

If desired, additional process steps can be carried out by flowing a third gas mixture through first gas line 210 into plasma processing chamber 240. As illustrated in the embodiment of FIG. 2A, a third gas mixture flows though first gas line 210, (as indicated by the single-headed arrows), while second gas line 211 is simultaneously evacuated (as indicated by the double-headed arrows). A third plasma is generated with the third gas mixture for processing the wafer in plasma processing chamber 240.

This process of alternating gas distribution between first gas line 210 and second gas line 211 can be further implemented for the distribution of a fourth gas mixture, fifth gas mixture, etc., to plasma processing chamber 240 until the multi-step processing of the wafer has been completed.

Figure 3A:
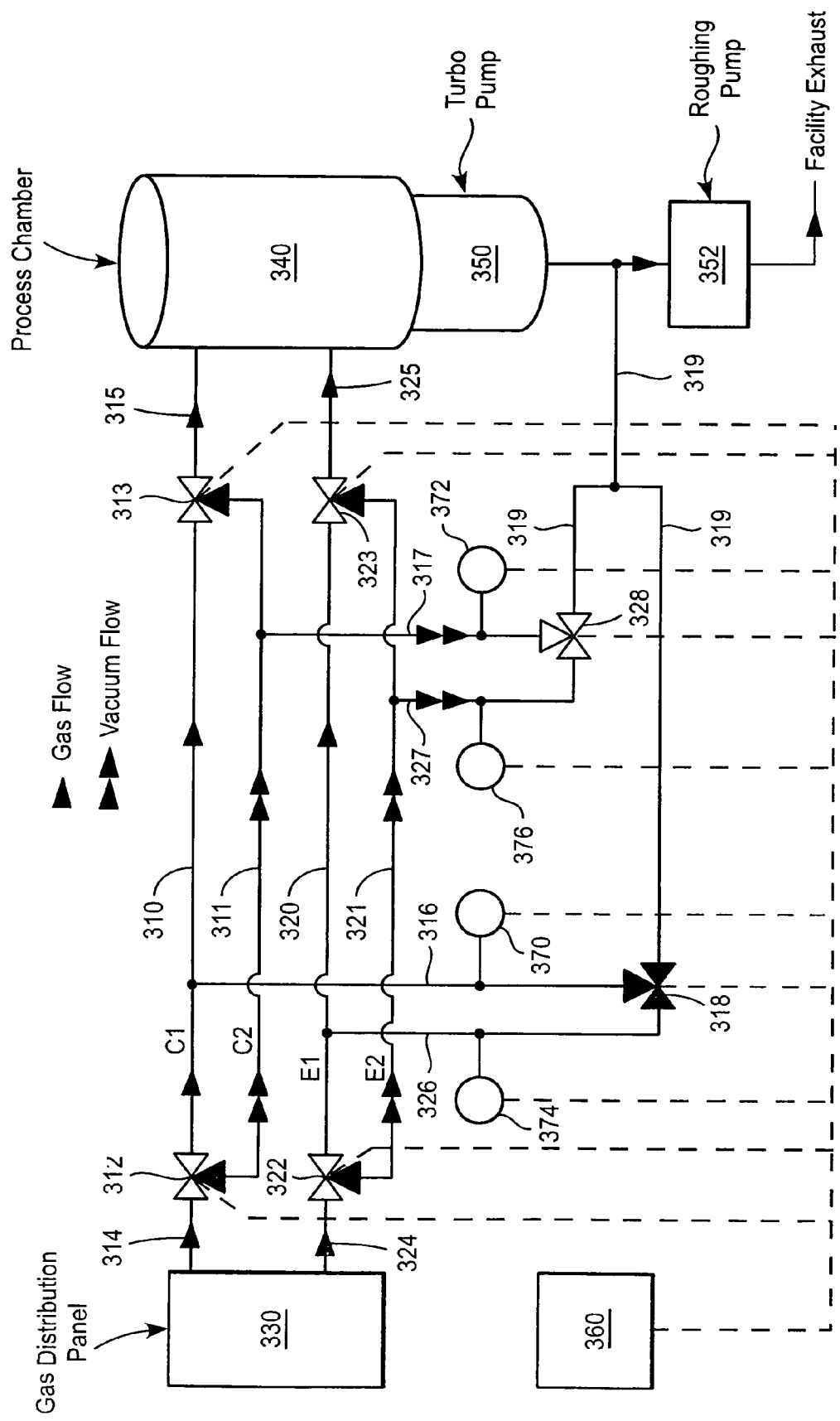
FIGS. 3A-3B illustrate an embodiment of the gas distribution system with two pairs of alternating gas lines to supply gas mixtures to center and edge zones of the plasma process chamber.
Figure 3B:
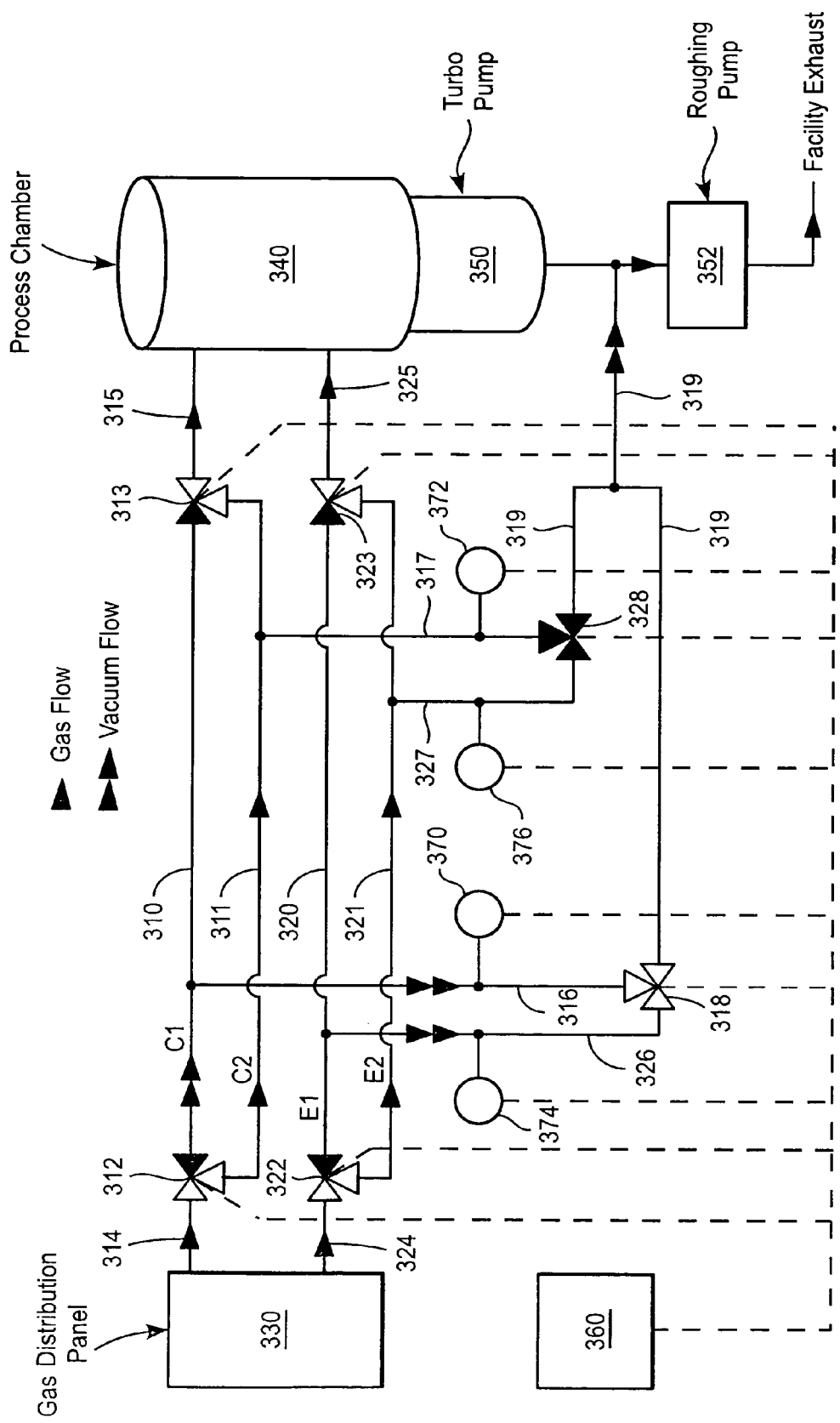

FIGS. 3A and 3B illustrate an embodiment of a gas delivery system, including first gas line 310, second gas line 311, third gas line 320 and fourth gas line 321 for gas delivery to a center zone and an edge zone surrounding the center zone for plasma process chamber 340. The pressure in plasma process chamber 340 is maintained at a vacuum pressure (e.g., >50 to 200 mTorr for a capacitively coupled plasma process chamber) by turbomolecular pump 350 and roughing pump 352. Gases removed from the plasma process chamber 340 and the gas lines by turbomolecular pump 350 and roughing pump 352 are released to the facilities exhaust system. First gas line 310 and second gas line 311 deliver processing gases to the center zone of plasma process chamber 340. Third gas line 320 and fourth gas line 321 deliver processing gases to the edge zone of plasma process chamber 340.

The flow of different gas mixtures are alternated between: (1) two primary gas lines, first gas line 310 and third gas line 320; and (2) two alternate gas lines, second gas line 311 and fourth gas line 321 to deliver gas mixtures from gas supply 330 to a plasma process chamber 340 containing a semiconductor wafer (not shown). In this embodiment, gas mixtures are delivered along first gas line 310 and third gas line 320, while second gas line 311 and fourth gas line 321 are simultaneously evacuated with roughing pump 352 and vice versa. Initially, all four gas lines are maintained in an evacuated state (e.g., a vacuum pressure below about 30 Torr, 20 Torr or 10 Torr).

FIG. 3A illustrates the flow of a first gas mixture though first gas line 310 and third gas line 320, (as indicated by the single-headed arrows), while second gas line 311 and fourth gas line 321 are simultaneously evacuated (as indicated by the double-headed arrows).

From FIG. 3A, a first valve arrangement 312 and second valve arrangement 313 are connected to upstream and downstream ends of first gas line 310 and second gas line 311. A first gas distribution outlet line 314 is connected between the gas supply 330 and first valve arrangement 312; first chamber inlet line 315 is connected between the second valve arrangement 313 and plasma process chamber 340. Additionally, a third valve arrangement 322 and fourth valve arrangement 323 are connected to upstream and downstream ends of third gas line 320 and fourth gas line 321. A second gas distribution outlet line 324 is connected between the gas supply 330 and third valve arrangement 322; a second chamber inlet line 325 is connected between the fourth valve arrangement 323 and plasma process chamber 340.

Roughing pump 352 is in fluid communication with first gas line 310, second gas line 311, third gas line 320 and fourth gas line 321, along first evacuation line 316, second evacuation line 317, third evacuation line 326 and fourth evacuation line 327, respectively. Fifth valve arrangement 318 is connected between a vacuum line 319 and the downstream ends of first evacuation line 316 and third evacuation line 326. Sixth valve arrangement 328 is connected between the vacuum line 319 and the downstream ends of second evacuation line 317 and fourth evacuation line 327. Vacuum line 319 is connected between fifth valve arrangement 318, sixth valve arrangement 328 and roughing pump 352.

First valve arrangement 312 and second valve arrangement 313 restrict the flow of gas mixtures either along first gas line 310 or second gas line 311, which distributes gas mixtures to the central zone of plasma process chamber 340. Likewise, third valve arrangement 322 and fourth valve arrangement 323 restrict the flow of gas mixtures either along third gas line 320 or fourth gas line 321, which distributes gas mixtures to the edge zone of plasma process chamber 340. The darkened regions of first valve arrangement 312 and second valve arrangement 313 indicate that the valves prevent flow of gas from supply 330 to second gas line 311. Likewise, the darkened regions of third valve arrangement 322 and fourth valve arrangement 323 indicate that the valves prevent flow of gas from supply 330 to fourth gas line 321. In one embodiment, first valve arrangement 312, second valve arrangement 313, third valve arrangement 322 and fourth valve arrangement 323 can be double-actuated three-way gas valves, in which an electrical signal is used to actuate the valves between two gas flow positions. However, such three-way valves can be replaced with other valve arrangements such as a pair of valves as described above (e.g., Y-shaped double valve).

FIG. 3A also illustrates the simultaneous evacuation of second gas line 311 and fourth gas line 321. Fifth valve arrangement 318 is closed to prevent flow of gas along the first evacuation line 316 and the third evacuation line 326 (indicated by the darkened regions) to the vacuum line 319. Sixth valve arrangement 328 is open to selectively evacuate second gas line 311 and fourth gas line 321. In one embodiment, fifth valve arrangement 318 and sixth valve arrangement 328 are single-actuated three-way gas valves, in which a single electrical signal opens or closes all three inlets. However, other valve arrangements such as individual valves can be used on first evacuation line 316, second evacuation line 317, third evacuation line 326 and fourth evacuation line 327 (e.g., Y-shaped double valve).

From FIG. 3A, controller 360 is operable to actuate first valve arrangement 312, second valve arrangement 313, third valve arrangement 322, fourth valve arrangement 323, fifth valve arrangement 318 and sixth valve arrangement 328 to selectively flow the first mixed gas from the gas supply 330 to the processing chamber 340 along the first gas line 310 and third gas line 320, while the second gas line 311 and fourth gas line 321 are selectively evacuated by the roughing pump 352. Electrical connections from controller 360 to each individual valve are illustrated in FIG. 3A as dashed lines.

A first plasma is generated with the first gas mixture for processing the wafer in plasma process chamber 340. After etching with the first gas mixture has been completed, the first plasma is extinguished by terminating flow of the first gas mixture from gas supply 330. Thus, the changeover time between the termination of flow of the first gas mixture in first gas line 310 and third gas line 320 and the start of flow of the second gas mixture in second gas line 311 and fourth gas line 321 can be significantly reduced, compared to use of single lines to the plasma process chamber (i.e., FIG. 1B embodiment), because second gas line 311 and fourth gas line 321 are evacuated during flow of the first gas mixture in first gas line 310 and third gas line 320 and thus ready for switchover to the second gas mixture immediately upon termination of flow of the first gas mixture.

Remnants of the first gas mixture, second gas mixture, etc. can remain trapped in the first gas outlet line 314, first chamber inlet line 315, second gas outlet line 324 and second chamber inlet line 325, because these sections of the gas distribution system are not evacuated. To minimize such residual gas during changeover of the first gas mixture to the second gas mixture, the length of first gas outlet line 314, first chamber inlet line 315, second gas outlet line 324 and second chamber inlet line 325 should be minimized. For example, if first gas line 310, second gas line 311, third gas line 320 or fourth gas line 321 are individually about 8 meters in length, the lengths of first gas outlet line 314, first chamber inlet line 315, second gas outlet line 324 or second chamber inlet line 325 are less than 10% the length of first gas line 310, second gas line 311, third gas line 320 or fourth gas line 321, preferably less than 5% (e.g., <4%, <3% or <2%), e.g., about 12 to 15 centimeters in length.

A first pressure switch 370, a second pressure switch 372, third pressure switch 374 and fourth pressure switch 376 are arranged along first evacuation line 316, second evacuation line 317, third evacuation line 326 and fourth evacuation line 327, respectively. The pressure switches output signals to controller 360 to ensure that: (1) first gas line 310 and third gas line 320; and (2) second gas line 311 and fourth gas line 321 have been properly evacuated (e.g., a vacuum pressure below about 30 Torr, 20 Torr or 10 Torr) before gas changeover occurs. For example, before the flow of the first gas mixture begins through first gas line 310 and third gas line 320, the controller 360 monitors signals from first pressure switch 370 and third pressure switch 374 to ensure that first evacuation line 316, third evacuation line 326, first gas line 310 and third gas line 320 have been evacuated to a pressure of 10 Torr or lower. Likewise, before the flow of the second gas mixture through second gas line 311 and fourth gas line 321 begins, the controller 360 monitors signals from second pressure switch 372 and fourth pressure switch 376 to ensure that second evacuation line 317, fourth evacuation line 318, second gas line 311 and fourth gas line 321 have been evacuated to a pressure of 10 Torr or lower. Electrical connections from controller 360 to each individual pressure switch are illustrated in FIG. 3A as dashed lines.

FIG. 3B illustrates the flow of a second gas mixture though second gas line 311 and fourth gas line 321 (as indicated by the single-headed arrows), while first gas line 310 and third gas line 320 are simultaneously evacuated (as indicated by the double-headed arrows). The darkened regions of first valve arrangement 312 and second valve arrangement 313 indicate that the valves prevent flow of gas from gas supply 330 to plasma process chamber 340 along first gas line 310. Likewise, the darkened regions of third valve arrangement 322 and fourth valve arrangement 323 indicate that the valves prevent flow of gas from gas supply 330 to plasma process chamber 340 along third gas line 320. A second plasma is generated with the second gas mixture for processing the wafer in plasma processing chamber 340.

From FIG. 3B, controller 360 is operable to actuate first valve arrangement 312, second valve arrangement 313, third valve arrangement 322, fourth valve arrangement 323, fifth valve arrangement 318 and sixth valve arrangement 328 to selectively flow the second mixed gas from the gas supply 330 to the processing chamber 340 along the second gas line 311 and fourth gas line 321, while the first gas line 310 and third gas line 320 are selectively evacuated by roughing pump 352. Electrical connections from controller 360 to each individual valve are illustrated in FIG. 3B as dashed lines.

If desired, additional process steps can be carried out by flowing a third gas mixture through first gas line 310 and third gas line 320 into plasma processing chamber 340. As illustrated in the embodiment of FIG. 3A, a third gas mixture flows though first gas line 310 and third gas line 320, (as indicated by the single-headed arrows), while second gas line 311 and fourth gas line 321 are simultaneously evacuated (as indicated by the double-headed arrows). The darkened regions of first valve arrangement 312 and second valve arrangement 313 indicate that the valves are in the closed position along second gas line 311. Likewise, sixth valve arrangement 328 is closed along second evacuation line 317 and fourth evacuation line 327, as indicated by the darkened regions, to selectively evacuate second gas line 311 and fourth gas line 321. A third plasma is generated with the third gas mixture for processing the wafer in plasma processing chamber 340.

This process of alternating gas distribution between: (1) two primary gas lines, first gas line 310 and third gas line 320; and (2) two alternate gas lines, second gas line 311 and fourth gas line 321 can be further implemented for the distribution of a fourth gas mixture, fifth gas mixture, etc., to plasma processing chamber 340 until the multi-step processing of the wafer has been completed.

Figure 4A:
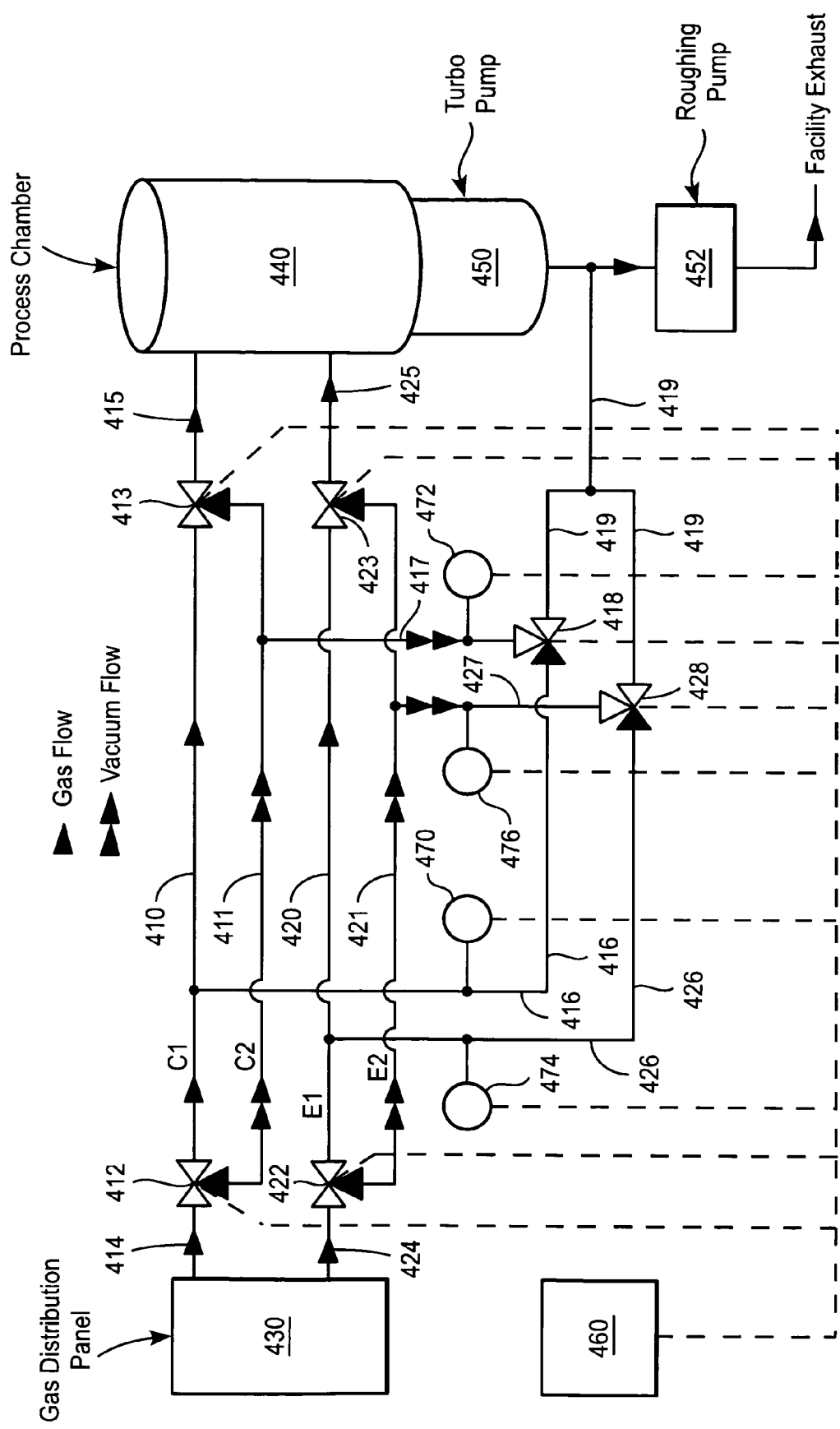
FIGS. 4A-4B illustrate another embodiment of the gas distribution system with two pairs of alternating gas lines to supply gas mixtures to center and edge zones.
Figure 4B:
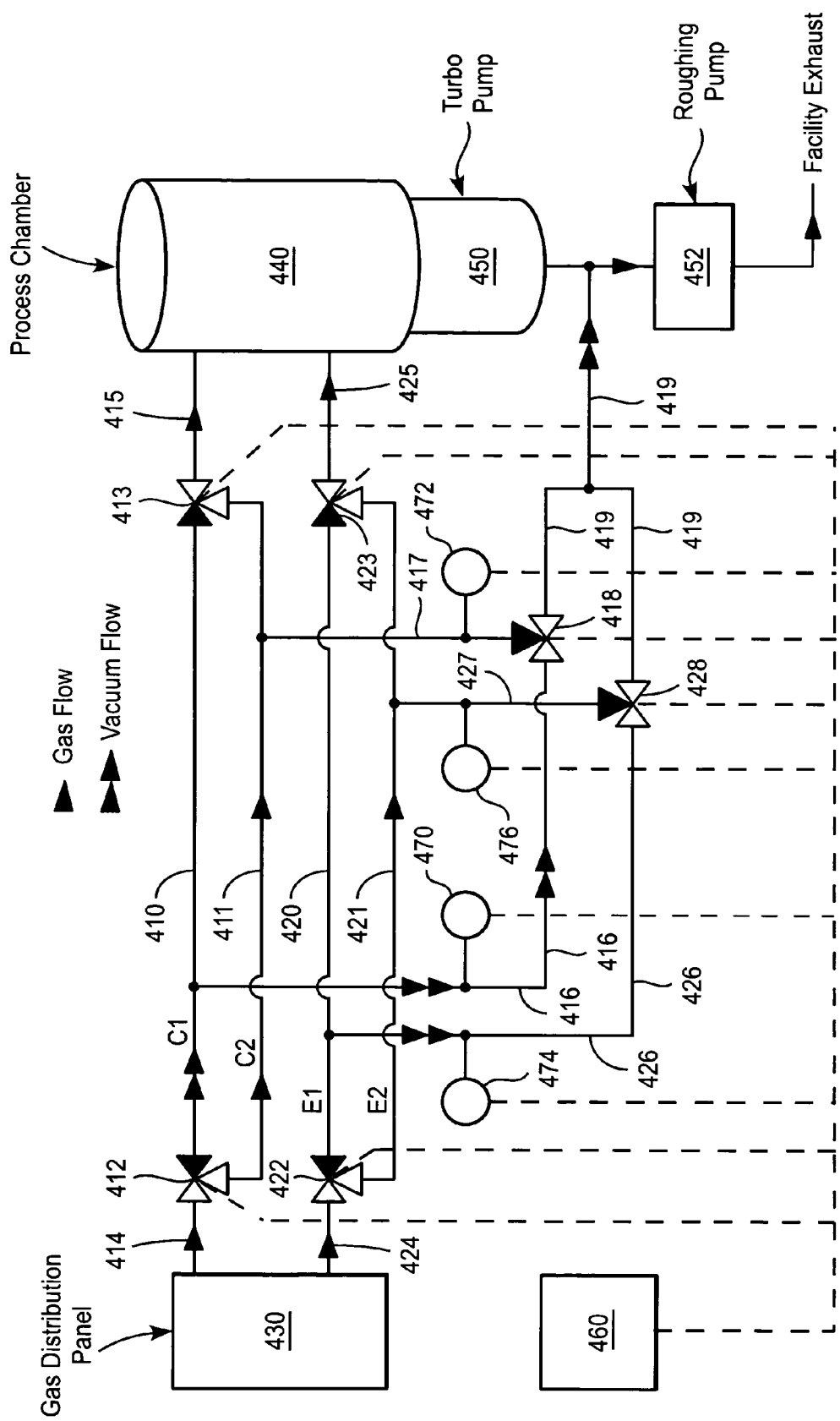

FIGS. 4A and 4B illustrate another embodiment of a gas delivery system, including first gas line 410, second gas line 411, third gas line 420 and fourth gas line 421 for gas delivery to a center zone and an edge zone. First gas line 410 and second gas line 411 deliver processing gases to the center zone of plasma process chamber 440. Third gas line 420 and fourth gas line 421 deliver processing gases to the edge zone of plasma process chamber 440.

The flow of gas mixtures is alternated between: (1) two primary gas lines, first gas line 410 and third gas line 420; and (2) two alternate gas lines, second gas line 411 and fourth gas line 421 to deliver gas mixtures from gas supply 430 to plasma process chamber 440 containing a semiconductor wafer (not shown). In this embodiment, gas mixtures are delivered along first gas line 410 and third gas line 420, while second gas line 411 and fourth gas line 421 are simultaneously evacuated with roughing pump 452 and vice versa. Initially, prior to plasma processing a wafer in plasma process chamber 440, first gas line 410, second gas line 411, third gas line 420 and fourth gas line 421 are maintained in an evacuated state (e.g., a vacuum pressure below about 30 Torr, 20 Torr or 10 Torr).

FIG. 4A illustrates the flow of a first gas mixture though two primary gas lines, first gas line 410 and third gas line 420, (as indicated by the single-headed arrows), while two alternate gas lines, second gas line 411 and fourth gas line 421 are simultaneously evacuated (as indicated by the double-headed arrows).

From FIG. 4A, a first valve arrangement 412 and second valve arrangement 413 are connected to upstream and downstream ends of first gas line 410 and second gas line 411. A first gas outlet line 414 is connected between the gas supply 430 and first valve arrangement 412; a first chamber inlet line 415 is connected between the second valve arrangement 413 and plasma process chamber 440. Roughing pump 452 is in fluid communication with first gas line 410 and second gas line 411 along first evacuation line 416 and second evacuation line 417, respectively. Third valve arrangement 418 is connected between the vacuum line 419 and the downstream ends of first evacuation line 416 and second evacuation line 417.

Additionally, a fourth valve arrangement 422 and fifth valve arrangement 423 are connected to upstream and downstream ends of third gas line 420 and fourth gas line 421. A second gas outlet line 424 is connected between the gas supply 430 and fourth valve arrangement 422; a second chamber inlet line 425 is connected between the fifth valve arrangement 423 and plasma process chamber 440. Roughing pump 452 is in fluid communication with third gas line 420 and fourth gas line 421 along third evacuation line 426 and fourth evacuation line 427, respectively. Sixth valve arrangement 428 is connected between the vacuum line 419 and the downstream ends of third evacuation line 426 and fourth evacuation line 427.

First valve arrangement 412 and second valve arrangement 413 restrict the flow of gas mixtures either along first gas line 410 or second gas line 411, which distributes gas mixtures to the center zone of plasma process chamber 440. Likewise, fourth valve arrangement 422 and fifth valve arrangement 423 restrict the flow of gas mixtures either along third gas line 420 or fourth gas line 421, which distributes gas mixtures to the edge zone of plasma process chamber 440. The darkened regions of first valve arrangement 412 and second valve arrangement 413 indicate that the valves are in the closed position along second gas line 411. Likewise, the darkened regions of fourth valve arrangement 422 and fifth valve arrangement 423 indicate that the valves are in the closed position along the fourth gas line 421. In one embodiment, first valve arrangement 412, second valve arrangement 413, fourth valve arrangement 422 and fifth valve arrangement 423 can be double-actuated three-way gas valves, in which an electrical signal is used to actuate the valve between two positions. However, other valve arrangements such as individual valves can be used to accomplish gas switching on first gas line 410, second gas line 411, third gas line 420 and fourth gas line 421 (e.g., Y-shaped double valve)

FIG. 4A also illustrates the simultaneous evacuation of second gas line 411 and fourth gas line 421. As illustrated in FIG. 4A, third valve arrangement 418 is closed along first evacuation line 416 (indicated by the darkened regions). Likewise, sixth valve arrangement 428 is closed along third evacuation line 426 to selectively evacuate second gas line 411 and fourth gas line 421. In one embodiment, third valve arrangement 418 and sixth valve arrangement 428 are double-actuated three-way gas valves, in which an electrical signal is used to actuate the valve between two gas flow positions. However, other valve arrangements such as individual valves can be used on first evacuation line 416, second evacuation line 417, third evacuation line 426 and fourth evacuation line 427 (e.g., Y-shaped double valve).

From FIG. 4A, controller 460 is operable to actuate first valve arrangement 412, second valve arrangement 413, third valve arrangement 418, fourth valve arrangement 422, fifth valve arrangement 423 and sixth valve arrangement 428 to selectively flow the first gas mixture from the gas supply 430 to the plasma process chamber 440 along the first gas line 410 and third gas line 420, while the second gas line 411 and fourth gas line 421 are selectively evacuated by the roughing pump 452. Electrical connections from controller 460 to each individual valve are illustrated in FIG. 4A with dashed lines.

A first plasma is generated with the first gas mixture for processing the wafer in plasma process chamber 440. After etching with the first gas mixture has been completed, the first plasma is extinguished by terminating flow of the first gas mixture from gas supply 430. Thus, the changeover time between the termination of flow of the first gas mixture in first gas line 410 and third gas line 420 and the start of flow of the second gas mixture in second gas line 411 and fourth gas line 421 can be significantly reduced, compared to use of single lines to the plasma process chamber (i.e., FIG. 1B embodiment), because second gas line 411 and fourth gas line 421 are evacuated during flow of the first gas mixture in first gas line 410 and third gas line 420 and thus ready for switchover to the second gas mixture immediately upon termination of flow of the first gas mixture.

Remnants of the first gas mixture, second gas mixture, etc. can remain trapped in the first gas outlet line 414, first chamber inlet line 415, second gas outlet line 424 and second chamber inlet line 425, because these sections of the gas distribution system are not evacuated. To minimize such residual gas during changeover of the first gas mixture to the second gas mixture, the length of first gas outlet line 414, first chamber inlet line 415, second gas outlet line 424 and second chamber inlet line 425 should be minimized. For example, if first gas line 410, second gas line 411, third gas line 420 or fourth gas line 421 are individually about 8 meters in length, the lengths of first gas outlet line 414, first chamber inlet line 415, second gas outlet line 424 or second chamber inlet line 425 are less than 10% the length of first gas line 410, second gas line 411, third gas line 420 or fourth gas line 421, preferably less than 5% (e.g., <4%, <3% or <2%), e.g. about 12 to 15 centimeters in length.

A first pressure switch 470, a second pressure switch 472, third pressure switch 474 and fourth pressure switch 476 are arranged along first evacuation line 416, second evacuation line 417, third evacuation line 426 and fourth evacuation line 427, respectively. The pressure switches output signals to controller 460 to ensure that: (1) first gas line 410 and third gas line 420; and (2) second gas line 411 and fourth gas line 421 have been properly evacuated (e.g., a vacuum pressure below about 30 Torr, 20 Torr or 10 Torr) before gas changeover occurs. For example, before the flow of the first gas mixture begins through first gas line 410 and third gas line 420, the controller 460 monitors signals from first pressure switch 470 and third pressure switch 474 to ensure that first evacuation line 416, third evacuation line 426, first gas line 410 and third gas line 420 have been evacuated to a pressure of 10 Torr or lower. Likewise, before the flow of the second gas mixture through second gas line 411 and fourth gas line 421 begins, the controller 460 monitors signals from second pressure switch 472 and fourth pressure switch 476 to ensure that second evacuation line 417, fourth evacuation line 418, second gas line 411 and fourth gas line 421 have been evacuated to a pressure of 10 Torr or lower. Electrical connections from controller 460 to each individual pressure switch are illustrated in FIG. 4A as dashed lines.

FIG. 4B illustrates the flow of a second gas mixture though two alternate gas lines, second gas line 411 and fourth gas line 421 (as indicated by the single-headed arrows), while two primary lines, first gas line 410 and third gas line 420 are simultaneously evacuated (as indicated by the double-headed arrows). The darkened regions of first valve arrangement 412 and second valve arrangement 413 indicate that the valves are in the closed position along first gas line 410. Likewise, the darkened regions of fourth valve arrangement 422 and fifth valve arrangement 423 indicate that the valves are in the closed position along third gas line 420.

From FIG. 4B, controller 460 is operable to actuate first valve arrangement 412, second valve arrangement 413, third valve arrangement 418, fourth valve arrangement 422, fifth valve arrangement 423 and sixth valve arrangement 428 to selectively flow the second mixed gas from the gas supply 430 to the processing chamber 440 along second gas line 411 and fourth gas line 421, while first gas line 410 and third gas line 420 are selectively evacuated by the roughing pump 452. Electrical connections from controller 460 to each individual valve are illustrated in FIG. 4B as dashed lines.

In another embodiment, multiple primary gas lines (e.g. three gas lines, four gas lines, five gas lines, etc.) can be used to deliver gas mixtures from a gas source to a process chamber. To significantly reduce the changeover time between the termination of flow between different gas mixtures, each of the primary lines can have a corresponding alternating line with the appropriate valve arrangements and evacuation lines.

EXAMPLE

Testing was performed to determine the delay time associated with evacuating gas lines to a specific pressure, after the flow of gas mixtures has been completed. This testing included the generation of pressure-time profiles for evacuating a single pair of gas lines (i.e. the embodiment of FIG. 1B) in comparison to alternating between a first pair of gas lines and a second pair of gas lines (i.e., the embodiment of FIGS. 3A and 3B). Testing was performed in an EXELAN® HPT™ plasma processing system, manufactured by Lam Research Corporation, located in Fremont, Calif. The approximate length of the gas lines, from the gas supply to the plasma processing chamber, was about 8 meters.

Figure 5:
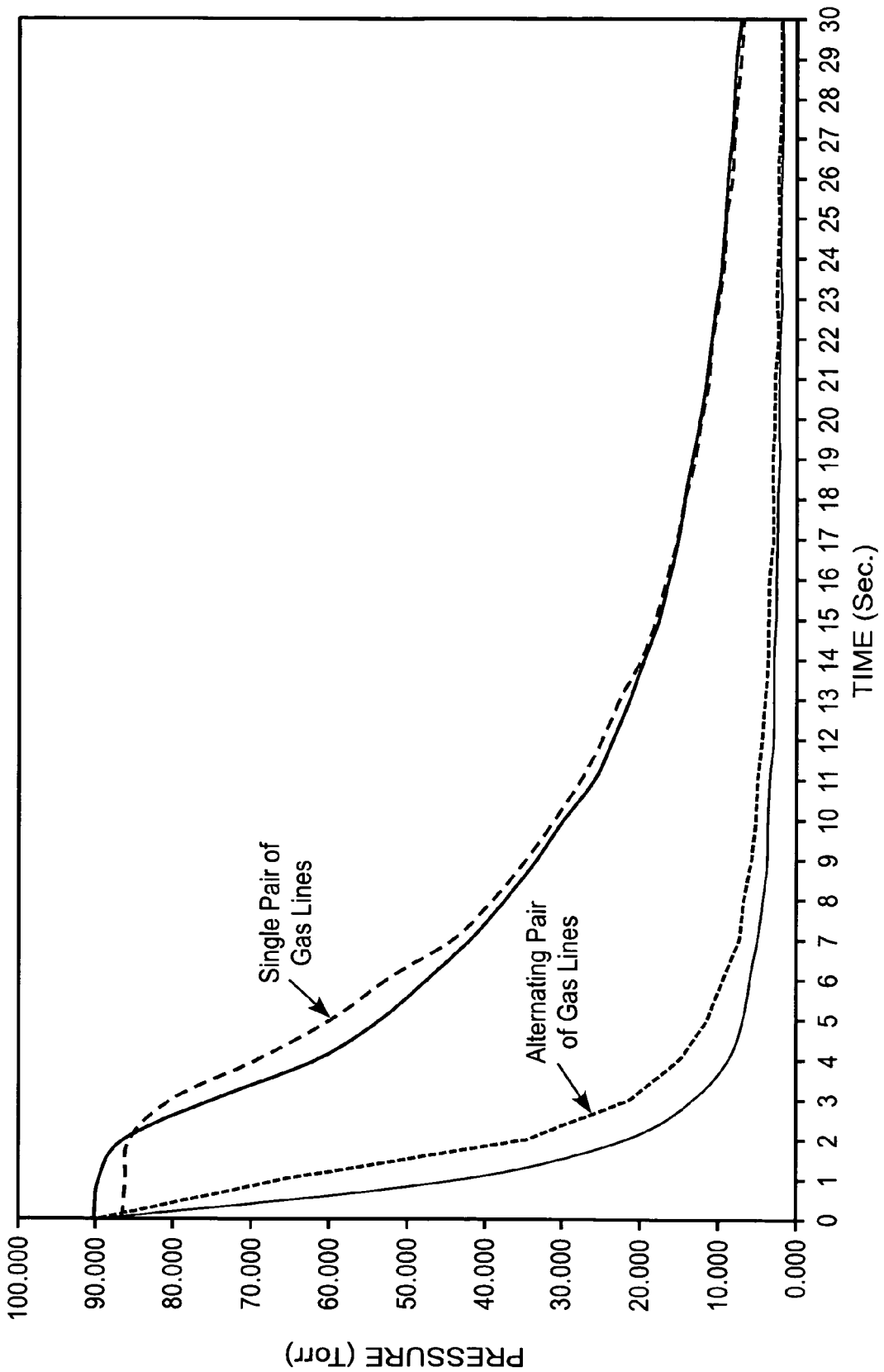
FIG. 5 is a graph of pressure-time profiles generated during the evacuation of a single pair of gas lines in comparison to the pressure-time profiles of a previously evacuated pair of gas lines for an alternating pair of gas lines.

In one test, an EXELAN® HPT™ plasma processing system with a configuration similar to the FIG. 1B embodiment was used. A first gas line 110B and a second gas line 112B were used to distribute a first gas mixture at a pressure of 110 Torr and a gas mixture of 600 standard cubic centimeters per minute (SCCM) Ar/50 SCCM $CF_4$/10 SCCM $N_2$ from gas supply 130B to plasma process chamber 140B. The gas flow was terminated and first gas line 110B supplying a center zone and second gas line 112B supplying an edge zone were evacuated with roughening pump 152B, in preparation for the flow of a second gas mixture. Because both first gas line 110B and a second gas line 112B were used to deliver the first gas mixture of Ar/$CF_4$/$N_2$, the same pair of gas lines must be evacuated with roughing pump 152B before the gas lines can be used to deliver a second gas mixture. Pressure-time profiles were measured using an upstream manometer located near the gas supply 130B and a downstream manometer, located near the plasma processing chamber 140B. The pressure-time profiles for the evacuation of a single pair of gas lines is illustrated in FIG. 5. The dashed line indicates the pressure-time profile measured by the upstream manometer, whereas the solid line indicates the pressure-time profile measured by the downstream manometer.

In a second test, an EXELAN® HPT™ plasma processing system with a configuration similar to the FIGS. 3A-3B embodiment was used. A first gas mixture was delivered by flowing a first gas mixture through first gas line 310 and third gas line 320, while simultaneously evacuating second gas line 311 and fourth gas line 321. A first gas mixture of 600 SCCM Ar/50 SCCM $CF_4$/10 SCCM $N_2$ was delivered from the gas supply 330 to the processing chamber 340 at pressure of 110 Torr along first gas line 310 and third gas line 320. After the Ar/$CF_4$/$N_2$ gas mixture flows in first gas line 310 and third gas line 320 was terminated, first valve arrangement 312, second valve arrangement 313, third valve arrangement 322 and fourth valve arrangement 323 were adjusted in preparation for flow of a second processing gas along second gas line 311 and fourth gas line 321. The pressure-time profiles of second gas line 311 and fourth gas line 321 were measured during evacuation with roughing pump 352. Pressure-time profiles during evacuation were measured using an upstream manometer located near the gas supply 330 and a downstream manometer, located near the plasma processing chamber 340. These pressure-time profiles are illustrated in FIG. 5. The dashed line indicates the pressure-time profile measured by the upstream manometer, whereas the solid line indicates the pressure-time profile measured by the downstream manometer.

As seen in FIG. 5, the alternating pair of gas lines (i.e., FIGS. 3A and 3B embodiment) significantly reduces evacuation time delays, in comparison to evacuation time associated with a single pair of gas lines (i.e., FIG. 1B embodiment), after the flow of the gas mixtures has been completed.

While the invention has been described in detail with reference to specific embodiments thereof, it will be apparent to those skilled in the art that various changes and modifications can be made, and equivalents employed, without departing from the scope of the appended claims.

What is claimed is:

1. A gas distribution system for supplying a gas mixture to a plasma process chamber, comprising:
   a first valve arrangement connected to upstream ends of a first gas line and a second gas line;
   a second valve arrangement connected to downstream ends of the first gas line and the second gas line;
   a first gas distribution outlet line connected between a source of gas supply and upstream ends of both first and second gas lines through the first valve arrangement; and
   a first chamber inlet line connected between a plasma chamber and to both downstream ends of first and second gas lines through the second valve arrangement;
   a first evacuation line connected to the first gas line at a location between the first valve arrangement and the second valve arrangement, the first evacuation line being in fluid communication with a vacuum line;
   a second evacuation line connected to the second gas line at a location between the first valve arrangement and the second valve arrangement, the second evacuation line being in fluid communication with the vacuum line; and
   a controller configured to actuate the first valve arrangement and second valve arrangement to selectively flow the gas mixture from the gas supply to the plasma process chamber through the first gas line while the second gas line being closed at both upstream and downstream ends is selectively evacuated by the vacuum line; or to selectively flow the gas mixture from the gas supply to the plasma process chamber through the second gas line while the first gas line being closed at both ends is selectively evacuated by the vacuum line.

2. The gas distribution system of claim 1, further comprising:
   a third valve arrangement connected between the vacuum line and the downstream ends of the first evacuation line and the second evacuation line; and
   the controller further configured to actuate the third valve arrangement to selectively evacuate the second gas line through the second evacuation line and the vacuum line while the gas mixture flows from the gas supply to the plasma process chamber through the first gas line; or to selectively evacuate the first gas line through the first evacuation line and the vacuum line while the gas mixture flows from the gas supply to the plasma process chamber through the second gas line while the first gas line is selectively evacuated by the vacuum line.

3. The gas distribution system of claim 2, further comprising:
   a fourth valve arrangement connected to upstream ends of a third gas line and a fourth gas line;
   a fifth valve arrangement connected to downstream ends of the third gas line and the fourth gas line;
   a second gas distribution outlet line connected between the gas supply and the fourth valve arrangement and a second chamber inlet line connected between the fifth valve arrangement and the plasma process chamber;
a third evacuation line connected to the third gas line at a location between the fourth valve arrangement and the fifth valve arrangement, the third evacuation line being in fluid communication with the vacuum line;
a fourth evacuation line connected to the fourth gas line at a location between the fourth valve arrangement and the fifth valve arrangement, the fourth evacuation line being in fluid communication with the vacuum line;
a sixth valve arrangement connected between the vacuum line and downstream ends of the third evacuation line and fourth evacuation line;
the controller further configured to actuate the fourth valve arrangement, fifth valve arrangement and sixth valve arrangement to selectively flow the gas mixture from the gas supply to inner and outer zones in the plasma process chamber through the third gas line simultaneously with the first gas line, while the fourth gas line is selectively evacuated by the vacuum line simultaneously with the second gas line; or selectively flow the gas mixture from the gas supply to inner and outer zones in the plasma process chamber through the fourth gas line simultaneously with the second gas line while the third gas line is selectively evacuated by the vacuum line simultaneously with the first gas line.

4. The gas distribution system of claim 3, wherein each of the first valve arrangement, second valve arrangement, third valve arrangement, fourth valve arrangement, fifth valve arrangement and sixth valve arrangement is a double-actuated three-way gas valve.

5. A plasma processing apparatus, comprising the gas distribution system according to claim 3, wherein the length of the first gas distribution outlet line, the second gas distribution outlet line, the first chamber inlet line or the second chamber inlet line is less than 5% of the length of the first gas line, the second gas line, the third gas line or the fourth gas line.

6. The gas distribution system of claim 1, further comprising:
a third valve arrangement connected to upstream ends of a third gas line and a fourth gas line;
a fourth valve arrangement connected to downstream ends of the third gas line and the fourth gas line;
a second gas distribution outlet line connected between the gas supply and the third valve arrangement and a second chamber inlet line connected between the fourth valve arrangement and the plasma process chamber;
a third evacuation line connected to the third gas line at a location between the third valve arrangement and the fourth valve arrangement, the third evacuation line being in fluid communication with the vacuum line;
a fourth evacuation line connected to the fourth gas line at a location between the third valve arrangement and the fourth valve arrangement, the fourth evacuation line being in fluid communication with the vacuum line;
a fifth valve arrangement connected between the vacuum line and the downstream ends of the first evacuation line and the third evacuation line;
a sixth valve arrangement connected between the vacuum line and the downstream ends of the second evacuation line and the fourth evacuation line; and
the controller configured to actuate the third valve arrangement, fourth valve arrangement, fifth valve arrangement and sixth valve arrangement to selectively flow the gas mixture from the gas supply to the plasma process chamber through the first gas line and the third gas line, while the second gas line and the fourth gas line are simultaneously evacuated; or to selectively flow the gas mixture from the gas supply to the plasma process chamber through the second gas line and the fourth gas line, while the first gas line and the third gas line are simultaneously evacuated.

7. The gas distribution system of claim 6, wherein each of the first valve arrangement, second valve arrangement, third valve arrangement and fourth valve arrangement is a double-actuated three-way gas valve; and the fifth valve and sixth valve is a single-actuated three-way gas valve.

8. The gas distribution system of claim 6, further comprising a first pressure switch arranged along the first evacuation line, a second pressure switch arranged along the second evacuation line, a third pressure switch arranged along the third evacuation line and a fourth pressure switch arranged along the arranged along the fourth evacuation line, the first pressure switch, the second pressure switch, the third pressure switch and the fourth pressure switch operable to supply signals to the controller as to when the first evacuation line, the second evacuation line, the third evacuation line and the fourth evacuation line are in an evacuated state.

9. The gas distribution system of claim 6, wherein the first gas line and the second gas line are adapted to supply the gas mixture to a center zone of a showerhead in the plasma process chamber, and the third gas line and the fourth gas line are adapted to supply the gas mixture to an edge zone of the showerhead in the plasma process chamber.

10. A plasma processing apparatus, comprising the gas distribution system according to claim 1 in fluid communication with the plasma process chamber.

11. A plasma processing apparatus, comprising the gas distribution system according to claim 1, wherein the length of the first gas distribution outlet line or the first chamber inlet line is less than 5% of the length of the first gas line or the second gas line.

12. A method of processing a semiconductor wafer in a plasma process chamber incorporating the gas distribution system of claim 1, comprising:
placing the semiconductor wafer in the plasma process chamber;
flowing a first gas mixture into the plasma process chamber through the first gas line, while simultaneously evacuating the second gas line with the vacuum line;
generating a first plasma with the first gas mixture;
processing the wafer with the first plasma;
extinguishing the first plasma by terminating a flow of the first gas mixture in the first gas line;
effecting gas changeover by flowing a second gas mixture into the plasma processing chamber through the second gas line within less than about 10 seconds of terminating the flow of the first gas mixture, while simultaneously evacuating the first gas line with the vacuum line;
generating a second plasma with the second gas mixture;
processing the wafer with the second plasma;
extinguishing the second plasma by terminating a flow of the second gas mixture in the second gas line.

13. The method of claim 12, wherein the gas changeover is effected within 5 seconds.

14. The method of claim 12, wherein the gas changeover is effected within 3 seconds.

15. The method of claim 12, further comprising:
flowing a third gas mixture into the plasma processing chamber through the first gas line, while simultaneously evacuating the second gas line with the vacuum line;
generating a third plasma with the third gas mixture;
processing the wafer with the third plasma;

extinguishing the third plasma by terminating a flow of the third gas mixture in the first gas line.

16. The method of claim 15, further comprising:

flowing a fourth gas mixture into the plasma processing chamber through the second gas line, while simultaneously evacuating the first gas line with the vacuum line;

generating a fourth plasma with the fourth gas mixture;

processing the wafer with the fourth plasma;

extinguishing the fourth plasma by terminating a flow of the fourth gas mixture in the second gas line.

17. The method of claim 12, wherein processing the wafer comprises a multi-step plasma etching process.

18. The method of claim 12, comprising:

evacuating the second gas line to a pressure of below about 30 Torr, while simultaneously flowing the first gas mixture into the plasma processing chamber through the first gas line; or evacuating the first gas line to a pressure of below about 30 Torr, while simultaneously flowing the second gas mixture into the plasma processing chamber through the second gas line.

19. The method of claim 12, comprising:

evacuating the second gas line to a pressure of below about 20 Torr, while simultaneously flowing the first gas mixture into the plasma processing chamber through the first gas line; or evacuating the first gas line to a pressure of below about 20 Torr, while simultaneously flowing the second gas mixture into the plasma processing chamber through the second gas line.

20. The method of claim 12, comprising:

evacuating the second gas line to a pressure of below about 10 Torr, while simultaneously flowing the first gas mixture into the plasma processing chamber through the first gas line; or evacuating the first gas line to a pressure of below about 10 Torr, while simultaneously flowing the second gas mixture into the plasma processing chamber through the second gas line.

* * * * *